United States Patent
Zhang

(10) Patent No.: US 6,191,720 B1
(45) Date of Patent: Feb. 20, 2001

(54) EFFICIENT TWO-STAGE DIGITAL-TO-ANALOG CONVERTER USING SAMPLE-AND-HOLD CIRCUITS

(75) Inventor: Ligang Zhang, Oceanside, CA (US)

(73) Assignee: International Business Machines Corporation, Armonk, NY (US)

(*) Notice: Under 35 U.S.C. 154(b), the term of this patent shall be extended for 0 days.

(21) Appl. No.: 09/223,042

(22) Filed: Dec. 30, 1998

(51) Int. Cl.[7] .................................................. H03M 1/66
(52) U.S. Cl. ................................................. 341/145; 341/144
(58) Field of Search ................................. 341/154, 145, 341/144, 155, 122, 141

(56) References Cited

U.S. PATENT DOCUMENTS

| | | | |
|---|---|---|---|
| 4,099,173 | * 7/1978 | Zeskind et al. | 341/155 |
| 4,973,979 | * 11/1990 | Ikeda | 341/154 |
| 5,252,975 | * 10/1993 | Yuasa et al. | 341/145 |
| 5,703,588 | * 12/1997 | Rivoir et al. | 341/159 |

* cited by examiner

Primary Examiner—Michael Tokar
Assistant Examiner—Peguy Jean JeanPierre
(74) Attorney, Agent, or Firm—Blakely, Sokoloff, Taylor, & Zafman LLP

(57) ABSTRACT

The present invention is a method and apparatus for converting a digital word into an analog quantity. A first plurality of signals is generated from a resistor network. A first signal is selected from the first plurality of signals based on a first half of the digital word. A second plurality of signals is generated from the resistor network using the selected first signal. A second signal is selected from the second plurality of signals based on a second half of the digital word. The second signal corresponds to the analog quantity.

20 Claims, 5 Drawing Sheets

EFFICIENT TWO-STAGE DIGITAL-TO-ANALOG CONVERTER USING SAMPLE-AND-HOLD CIRCUITS

BACKGROUND

1. Field of the Invention

This invention relates to data converters. In particular, the invention relates to digital-to-analog converters (DAC's).

2. Description of Related Art

A digital-to-analog converter (DAC) usually includes a resistor network and an array of switches or multiplexer circuit. The N-bit digital input is applied to the multiplexer circuit to control the switches. The size of the array of switches is a function of the number of input bits N. A large value of N may result in a prohibitively large array size. To reduce the complexity of the switch array, many DAC's utilize a multi stage switching scheme.

FIG. 1 illustrates a prior art 2-stage DAC. The prior art DAC 100 includes a first resistor network 110, a first stage multiplexer circuit 120, a second resistor network 130, and a second stage multiplexer circuit 140. The N-bit digital input is composed of J most significant bits (MSB's) and K least significant bits (LSB's).

The first resistor network 110 includes a series of resistors $R_{1,0}, R_{1,1}, \ldots R_{1,2}{}^J$ whose values are selected to provide $2^J$ voltage values. The first stage multiplexer circuit 120 selects one out of the $2^J$ voltage values as provided by the first resistor network 110. The multiplexer circuit 120 is controlled by the J most significant bits (MSB's) of the N-bit input. The second resistor network 130 divides the voltage output of the first stage multiplexer circuit 120 into further $2^K$ voltage values. The second stage multiplexer circuit 140 selects one out of the $2^K$ voltage values to produce the final output voltage. The second stage multiplexer circuit 140 is controlled by the K least significant bits (LSB's) of the N-bit input.

To reduce the well understood "loading effect" of the second resistor network, a high unit resistance ratio between the second and the first resistor networks is required, which tends to increase the size of the converter and significantly impact the speed performance. There has been design which inserts two unit gain buffers in between the first and the second resistor networks. This method reduces the loading effect, but does not solve problems caused by the offset of the buffers.

Although the 2-stage DAC reduces the hardware complexity from the single stage DAC, the amount of hardware is still high. There are two resistor networks and two multiplexer circuits. For medium to high resolution DACs, it is desirable to reduce the hardware complexity further.

Therefore there is a need in the technology to provide a simple and efficient technique to reduce the hardware complexity in DAC.

SUMMARY

The present invention is a method and apparatus for converting a digital word into an analog quantity. A first plurality of signals is generated from a resistor network. A first signal is selected from the first plurality of signals based on a first half of the digital word. A second plurality of signals is generated from the resistor network using the selected first signal. A second signal is selected from the second plurality of signals based on a second half of the digital word. The second signal corresponds to the analog quantity.

In one embodiment, the digital-to-analog converter includes a resistor network, an input multiplexer, a selector, and top and bottom sample-and-hold circuits. The resistor network generates a first plurality of signals. The input multiplexer receives the digital word to provide a first half and a second half of the digital word. The selector is coupled to the resistor network to select first top and bottom signals from the first plurality of signals based on the first half of the digital word. The top and bottom sample-and-hold circuits are coupled to the selector to provide top and bottom feedback signals from the selected first top and bottom signals to the resistor network. The resistor network generates a second plurality of signals. The selector selects second top and bottom signals from the second plurality of signals based on the second half of the digital word. One of the second top and bottom signals corresponds to the analog quantity.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

The present invention is a method and apparatus to convert a digital word into an analog quantity using sample-and-hold circuits. In a preferred embodiment, two sample-and hold circuits are used in a two-stage scheme to reduce loading. In another embodiment, a dual clocking scheme allows a single resistor network to be used with two sample-and-hold circuits. The technique significantly enhances the differential non-linearity (DNL) performance of the converter and reduces the hardware complexity.

Figure 2:
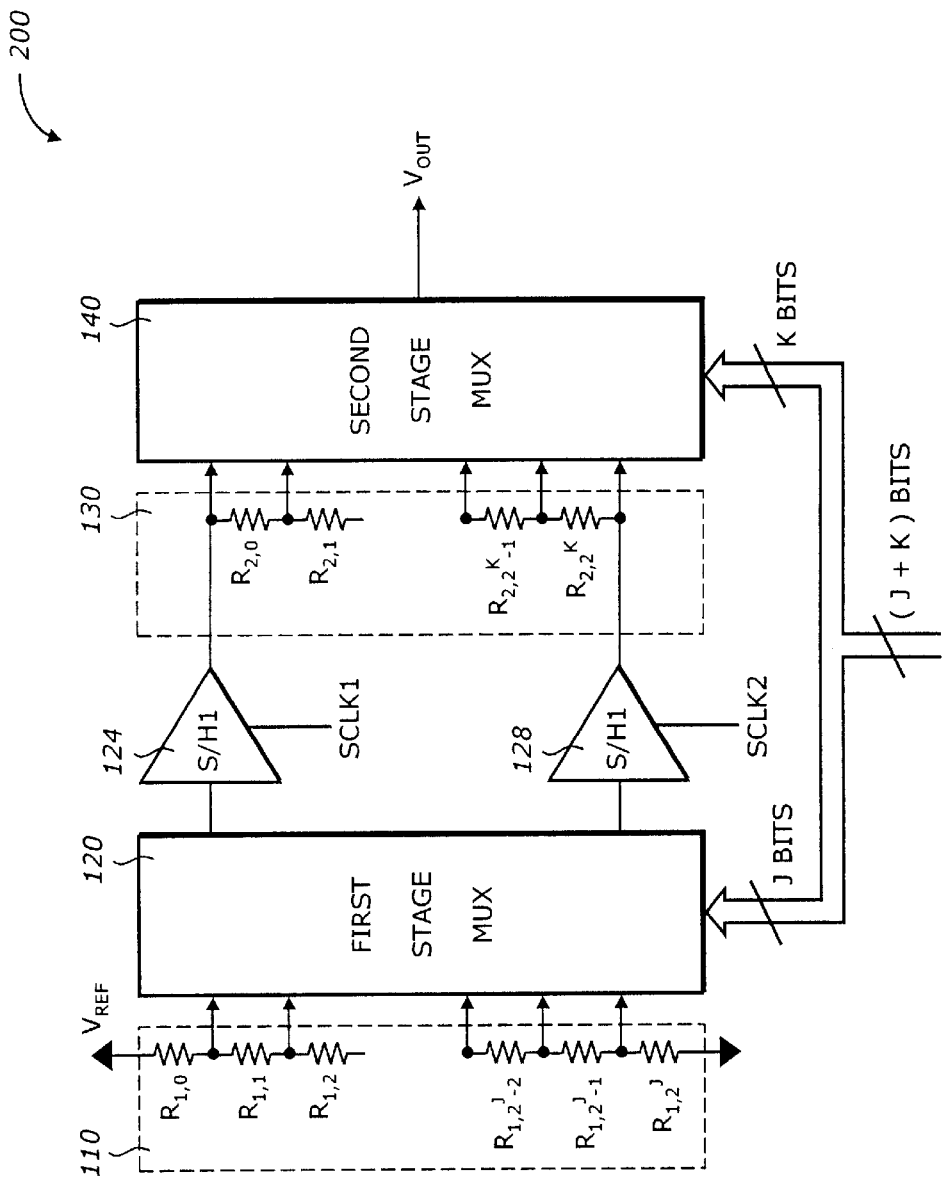
FIG. 2 is a diagram illustrating a two-stage DAC using sample-and-hold circuits according to a preferred embodiment of the invention.

FIG. 2 is a diagram illustrating a two-stage DAC 200 using sample-and-hold circuits according to a preferred embodiment of the invention. The DAC 200 includes the first resistor network 110, the first stage multiplexer circuit 120, two sample-and-hold circuits 124 and 128, the second resistor network 130, and the second stage multiplexer circuit 140.

Figure 1:
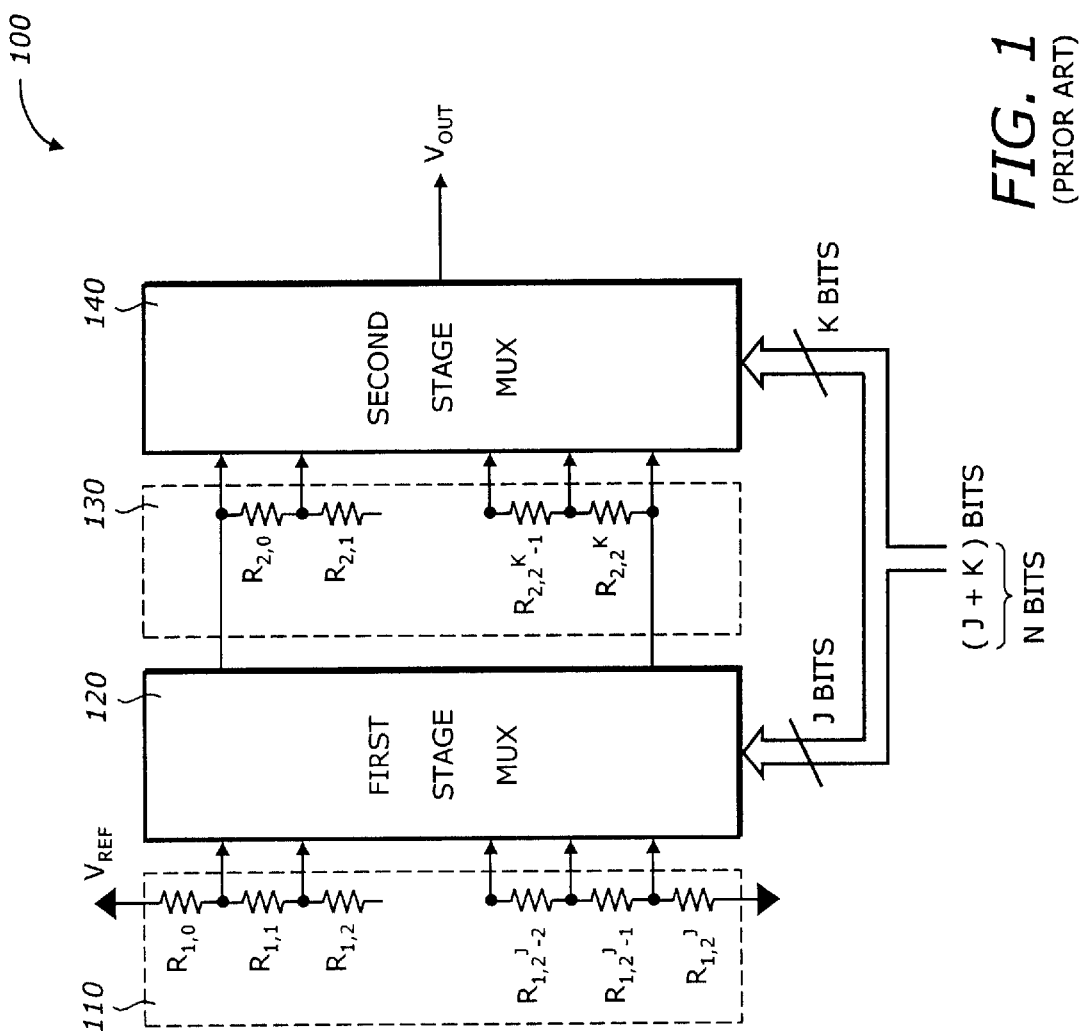
FIG. 1 is a diagram illustrating a prior art two-stage DAC.

The first and second resistor networks 110 and 130, the first and second stage multiplexer circuits 120 and 140, respectively, are essentially similar to the prior art DAC 100 as shown in FIG. 1. The N-bit digital input is divided into J MSB's and K LSB's. The J MSB's and the K LSB's control the first and second stage multiplexer circuits 120 and 140, respectively.

The sample-and-hold (S/H) circuits 124 and 128 sample the upper and lower voltages as selected by the first stage multiplexer circuit 120. The S/H circuits 124 and 128 are clocked by two clock signals SCLK1 and SCLK2. Typically the two clock signals SCLK1 and SCLK2 are the same to synchronize the sampling of the voltage signals. The S/H circuits 124 and 128 provide the sampled first stage voltage values to be subsequently divided by the second resistor network 130 and the second stage multiplexer circuit 140. By using the S/H circuits 124 and 128, there is negligible current drawn from the first stage multiplexer circuit 120. In addition, the second resistor network 130 is isolated from the first stage multiplexer circuit 120 and therefore does not impose any resistor loading on the first stage multiplexer circuit 120.

The DAC 200 in FIG. 2 effectively eliminates the resistor loading. However, the two S/H circuits 124 and 128 add additional hardware to the circuit. In addition, the op-amps in the two S/H circuits 124 and 128 have sufficient voltage gain, there will be negligible gain errors introduced into the sampled voltages, but offset errors caused by the two S/H circuits 124 and 128 may cause inaccuracy. Notice that if the two resistor networks 110 and 130 and the two multiplex circuits 120 and 140 are combined, the hardware complexity can be significantly reduced. This can be accomplished by using sample-and-hold circuits.

Figure 3:
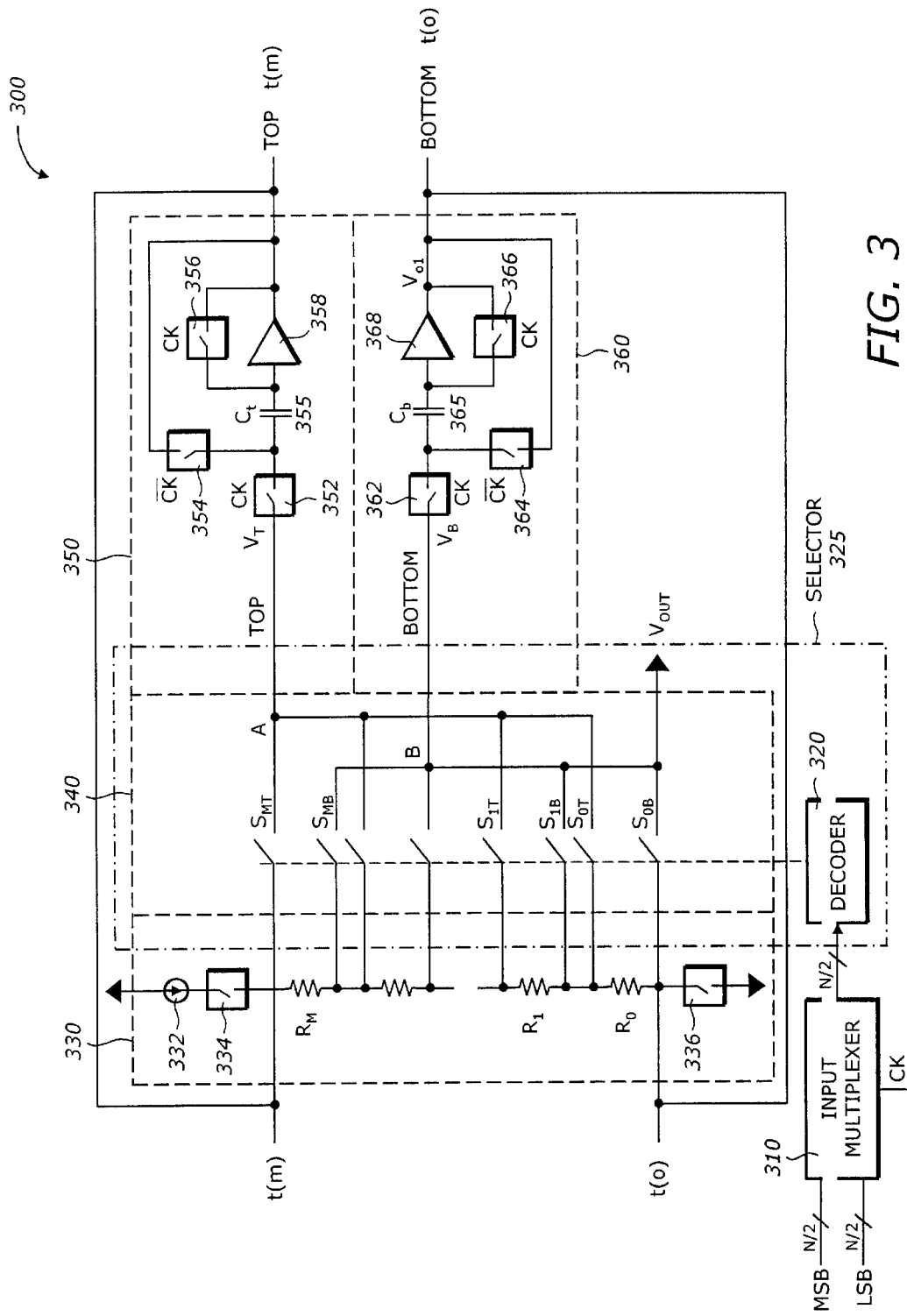
FIG. 3 is a diagram illustrating a two-stage DAC using a single resistor network and a single multiplexer circuit according to a preferred embodiment of the invention.

FIG. 3 is a diagram illustrating a two-stage DAC 300 using a single resistor network and a single multiplexer circuit according to a preferred embodiment of the invention. The DAC 300 includes an input multiplexer 310, a selector 325, a resistor ladder network 330, a top S/H circuit 350 and a bottom S/H circuit 360. The DAC 300 receives the N-bit digital input word which is divided into N/2 MSBs and N/2 LSBs. The selector 325 includes a decoder 320 and a switching array 340.

The input multiplexer 310 receives two halves of the N-bit input word. The first half is the N/2 MSB's and the second half is the N/2 LSB's. In a preferred embodiment, the value of N is an even number (e.g., 10, 12, 14, 16) so that each half has the same number of bits. As is known by one skilled in the art, the two halves may have different number of bits. The input multiplexer 310 is controlled by a clock signal CK. When the CK signal is at one state (e.g., HIGH), the input multiplexer selects the MSB half. When the CK signal is at another state (e.g., LOW), the input multiplexer selects the LSB half. The output of the input multiplexer 310 becomes the input to the decoder 320.

The decoder 320 receives the N/2-bit data from the input multiplexer 310 and generates $1+2^{N/2}$ control bits to the switching array 340. For example, if N=10, the decoder 320 receives the 5-bit data from the input multiplexer 310 and generates 33 control bits to the switching array 340. The decoder 320 is essentially a combinational logic circuit that decodes the 5-bit data into the corresponding control bit pattern to be applied to the switching array 340 to open or close the individual switches accordingly.

The resistor ladder network 330 includes a current source 332, two switches 334 and 336, and $2^{N/2}$ resistors $R_0$ through $R_{31}$. The current source 332 generates a reference constant current through the resistors to provide properly weighted voltages at the resistor network output taps. The resistor ladder network 330 generates a plurality of signals at the ends of the resistor segments. The two switches 334 and 336 synchronize the generation of the weighted voltage outputs with the conversion clocking signal and control the conversion active time period. The resistors $R_0$ through $R_{31}$ are tight tolerance resistors whose values are carefully selected to provide suitable voltages at the output taps of the network.

The switching array 340 includes $2^{N/2}+1$ switches connected to the output taps of the resistor ladder network 330. In a preferred embodiment, N is equal to 10 and there are 33 switches corresponding to 33 output taps of the resistor ladder network 330. Each output tap is connected to two switches, a top switch and a bottom switch. Resistor $R_0$ is connected to switches $S_{ob}$ and $S_{ot}$, resistor $R_1$ is connected to switches $S_{1b}$ and $S_{1t}$, etc. For M resistors, there are 2*(M+1) switches. The switches in the switching array 340 are connected such that the top switches ($S_{0t}, S_{1t}, \ldots S_{Mt}$) are tied together at the TOP point A and the bottom switches ($S_{0b}, S_{1b}, S_{2b}, \ldots S_{Mb}$) are tied together at the BOTTOM point B. The switches $S_{0b}, S_{0t}, S_{1b}, S_{1t}, \ldots, S_{Mb} S_{Mt}$ are controlled by the outputs of the decoder 320.

The top S/H circuit 350 receives the voltage signal at the TOP point A. The top S/H circuit 350 includes switches 352, 354, and 356, a capacitor Ct 355, an operational amplifier (op-amp) 358. The switches 352, 354, and 356 are controlled by the clock CK signal. Switches 352 and 356 are closed when the CK signal is at a first logic level (e.g., HIGH) and open when the CK signal is at a second logic level (e.g., LOW). Switch 354 is closed when the CK signal is at the second logic level and open when the CK signal is at the first logic level. The output of the S/H circuit 350 is connected back to the top tap, t(M), of the resistor ladder network 330. When the CK signal is at the first logic level, switches 352 and 356 are closed, the op-amp 358 is auto-zeroed, the capacitor Ct 355 charges to reach the voltage at the top point A, Vt. When the CK signal is at the second logic level, switches 352 and 356 are open while switch 354 is closed, the voltage Vt is held approximately constant due to charge conservation during the time the CK signal is at the second logic level. The output of the top S/H circuit 350 is held to the value of the Vt that was sampled at the previous time period when the CK signal was at the first logic level.

The bottom S/H circuit 360 receives the voltage at the bottom point B, Vb. The bottom S/H circuit 360 operates in the same manner as the top S/H circuit 350. The bottom S/H circuit 360 includes switches 362, 364, and 366, a capacitor Cb 365, an operational amplifier (op-amp) 368. The switches 362, 364, and 366 are controlled by the clock CK signal. Switches 362 and 366 are closed when the CK signal is at the first logic level and open when the CK signal is at the second logic level. Switch 364 is closed when the CK signal is at the second logic level and open when the CK signal is at the first logic level. The output of the bottom S/H circuit 360 is connected back to the bottom tap, t(0), of the resistor ladder network 330. When the CK signal is at the first logic level, switches 362 and 366 are closed, the op-amp 368 is auto-zeroed, the capacitor Cb 365 charges to reach the voltage at the bottom point B, Vb. When the CK signal is at the second logic level, switches 362 and 366 are open while switch 364 is closed, the voltage Vb is held approximately constant due to charge conservation during the time the CK signal is at the second logic level. The output of the bottom S/H circuit 360 is held to the value of the Vb that was sampled at the previous time period when the CK signal was at the first logic level.

By controlling the clocking CK signal, the two S/H circuits 350 and 360 are reconnected back to the resistor ladder network 330. Essentially, the resistor ladder network 330 is used two times. In the first period when the CK signal is at the first logic level, the MSB half of the N-bit input is selected and control the switch array 340 to generate the two coarse voltages $V_{t1}$ and $V_{b1}$. The two S/H circuits 350 and 360 sample the coarse voltage signals $V_{t1}$ and $V_{b1}$. In the second period when the CK signal is at the second logic level, the two S/H circuits 350 and 360 feedback the held voltages $V_t$ and $V_b$ to the resistor ladder network 330 to provide the voltages at points t(M) and t(0). The LSB half of the N-bit input is selected and control the switch array 340. The final output of the DAC 300 is then generated at the Vb bottom point. Obviously, the final output can also be taken as the voltage at the Vt top point.

It is seen that a single resistor ladder network 330 is used twice in a two-stage DAC to produce the desired voltage. Compared to the DAC circuit shown in FIG. 2, the DAC 300 in FIG. 3 requires only about half of the hardware.

Although the DAC 300 reduces the hardware complexity significantly, there is error caused by the S/H offset voltages and gain errors. The gain errors can be reduced by using high gain op-amps as S/H components. However, the offset voltages, mainly due to differential charge injection, among others, are more significant. Let the offset voltages of the top and bottom S/H circuits 350 and 360 be e1 and e2, respectively. The total error caused by the two offset voltages is e1–e2 which can be as high as |e1|+|e2|. To guarantee monotonicity, not taking into account any other error sources, each offset voltage has to be less than ½ LSB.

Figure 4A:
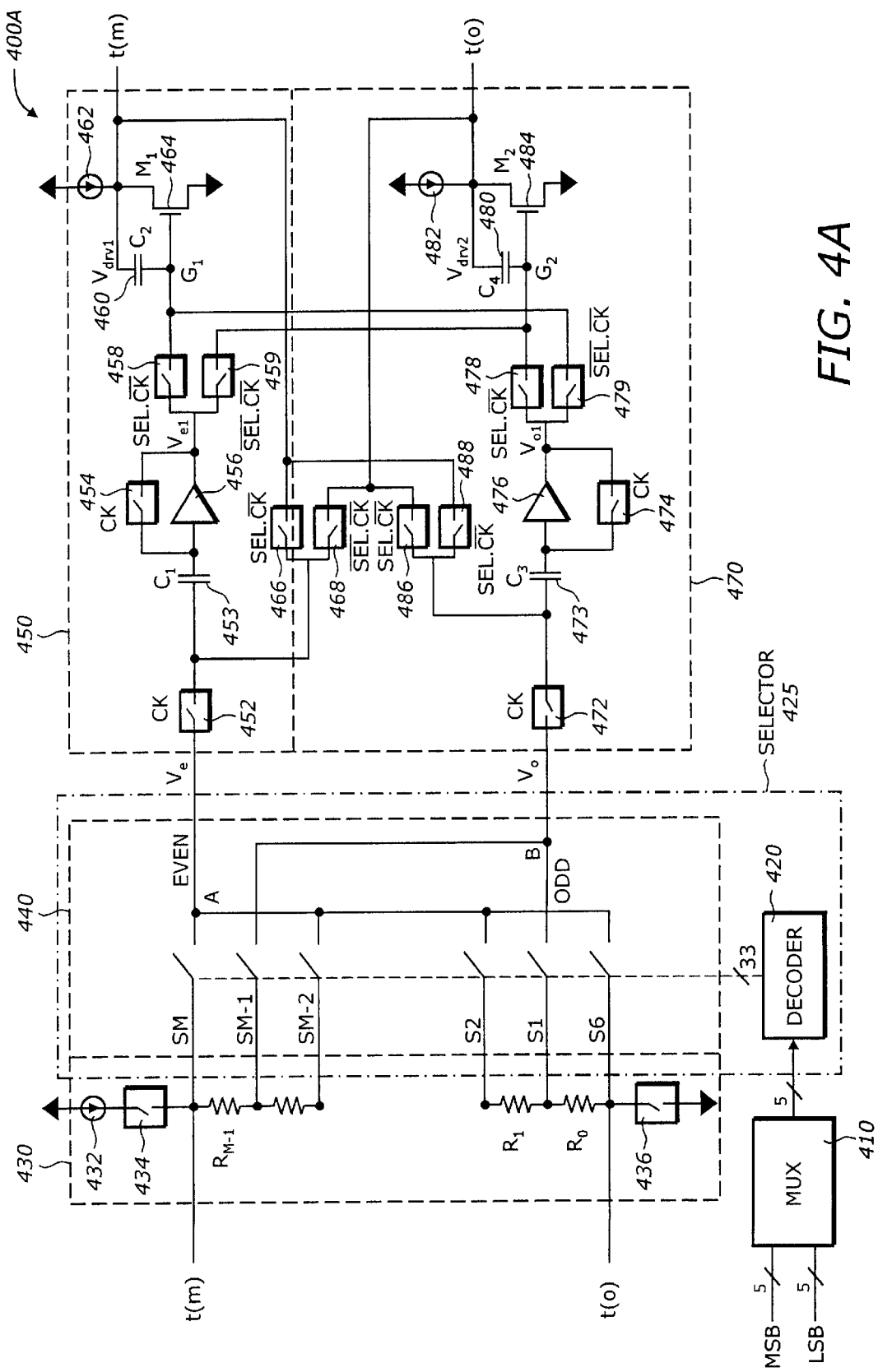
FIG. 4A is a diagram illustrating a two-stage DAC using a single resistor network, a single multiplexer circuit, and two-stage op-amp as sample-and-hold according to a preferred embodiment of the invention.

FIG. 4A is a diagram illustrating a two-stage DAC 400A using a single resistor network, a single multiplexer circuit, and two-stage op-amp as sample-and-hold according to a preferred embodiment of the invention. The DAC 400 includes the input multiplexer 310, a selector 425, a resistor ladder network 430, an even S/H circuit 450, and an odd S/H circuit 470. The even and odd S/H circuit may also be referred to as the top and bottom S/H circuits, and the designations "even" and "odd" may be referred to as "top" and "bottom", respectively. The selector 425 includes a decoder 420 and a switching array 440.

The input multiplexer 310 is essentially the same as in the DAC 300 (FIG. 3). The decoder 420 is similar to the decoder 320 in the DAC 300 (FIG. 3). The exact logic equation to generate the control bit pattern to the switching array 440 may be different because the arrangement of the switches in the switching array 440 is different. The resistor ladder network 430 is similar to the resistor ladder network 330 in the DAC 300 (FIG. 3), except that the tap structure is different. The resistor ladder network 430 has M resistors $R_0$ through $R_{M-1}$. There are M+1 taps, one at each end of each resistor. The switching array 440 includes M+1 switches, each switch is connected to the corresponding tap of the resistor ladder network 430. The switches are also connected such that the ends of the even-numbered switches are connected together at an EVEN point A, and the ends of the odd-numbered switches are connected together at an ODD point B. The numbering of the switches starts with the number 0 for the switch connected to the bottom resistor.

The even S/H circuit 450 is connected to the EVEN point A to receive the voltage signal Ve. The even S/H circuit 450 includes switches 452, 454, 458, 459, 466, and 468, a capacitor 453, an op-amp 456, a capacitor 460, a current source 462, and a transistor M1 464. The switches 452, 454, 458, 459, 466, and 468 are controlled by the clock signals CK and SEL. The switches 452 and 454 are controlled by the CK signal. The switches 452 and 454 are closed when the CK signal is at the first logic level, and open when the CK signal is at the second logic level. The switches 458 and 466 are closed when the SEL signal is at the first logic level and the CK signal is at the second logic level, and open otherwise. The switches 459 and 468 are closed when the SEL and CK signals are both at the second logic level, and open otherwise.

The odd S/H circuit 470 is connected to the ODD point B to receive the voltage signal Vo. The odd S/H circuit 470 includes switches 472, 474, 478, 479, 486, and 488, a capacitor 473, an op-amp 476, a capacitor 480, a current source 482, and a transistor M2 484. The switches 472, 474, 478, 479, 486, and 488 are controlled by the clock signals CK and SEL. The switches 472 and 474 are controlled by the CK signal. The switches 472 and 474 are closed when the CK signal is at the first logic level, and open when the CK signal is at the second logic level. The switches 478 and 486 are closed when the SEL signal is at the first logic level and the CK signal is at the second logic level, and open otherwise. The switches 479 and 488 are closed when the SEL and CK signals are both at the second logic level, and open otherwise.

The even and odd S/H circuits 450 and 460 interact with each other via the switches 458, 459, 466, 468, 478, 479, 486, and 488. The SEL signal is taken to be the LSB of the first half of the input word. Each of the S/H circuits 450 and 460 operate as a two-stage amplifier. The even S/H circuit 450 has the even first stage amplifier 456 and one of the two second stage amplifier 464 and 484. The odd S/H circuit 470 has the odd first stage amplifier 476 and the other second stage amplifier.

The second stage amplifier M1 464 is coupled to the even first stage amplifier 456 when the even voltage Ve at the input of the even S/H circuit 450 is higher than the odd voltage Vo at the input of the odd S/H circuit 470. This is also a condition when the LSB of the first half of the N-bit input word (e.g., bit 5 or b5) is a logical HIGH. The second stage amplifier M1 464 is coupled to the odd first stage amplifier 476 when Ve is lower than Vo. This is also the condition when b5 is a logical LOW.

Similarly, the second stage amplifier M2 484 is coupled to the odd first stage amplifier 476 when Ve is higher than Vo, and is coupled to the even first stage amplifier 456 when Ve is lower than Vo. By cross coupling the first stage amplifiers to the respective second stage amplifiers, no resistor tap voltages are sampled by both the S/H circuits. Therefore, the offset errors caused by the S/H circuits are considered as additions to the resistor tap voltages. The monotonicity is thus guaranteed.

The combined errors of the resistor ladder and the S/H circuits are mainly INL errors for the overall converter. In terms of DNL, those errors are reduced by a factor of roughly $2^{N/2}$.

In the first half of the clock cycle, the CK signal is at the first logic level. During this time, both the even and odd S/H circuits 450 and 470 operate in the sample mode. Switches 452, 454, 472, and 474 are closed. The op-amp 456 in the even S/H circuit 450 and the op-amp 476 in the odd S/H circuit 470 are auto-zeroed. At the same time, the op-amps 456 and 476 sample the voltages Ve and Vo, respectively. Switches 458, 459, 466, 468, 478, 479, 486, and 488 are open, leaving the two S/H circuits 450 and 470 separated.

In the second half of the clock cycle, the CK signal is at the second logic level. During this time, the coupling of the second stage amplifiers M1 464 and M2 484 depends on the signal level of SEL (or b5). When SEL is at the first logic level, switches 458 and 466 are closed, coupling M1 to the even amplifier 456 while switches 459 and 468 are open, decoupling M2 from the even amplifier 456. Similarly, switches 478 and 486 are closed, coupling M2 to the odd amplifier 476 while switches 479 and 488 are open, decoupling M1 from the odd amplifier 476. When SEL is at the second logic level, switches 458 and 466 are open, decoupling M1 from the even amplifier 456 while switches 459 and 468 are closed, coupling M2 to the even amplifier 456. Similarly, switches 478 and 486 are open, decoupling M2 from the odd amplifier 476 while switches 479 and 488 are closed, coupling M1 to the odd amplifier 476.

Figure 4B:
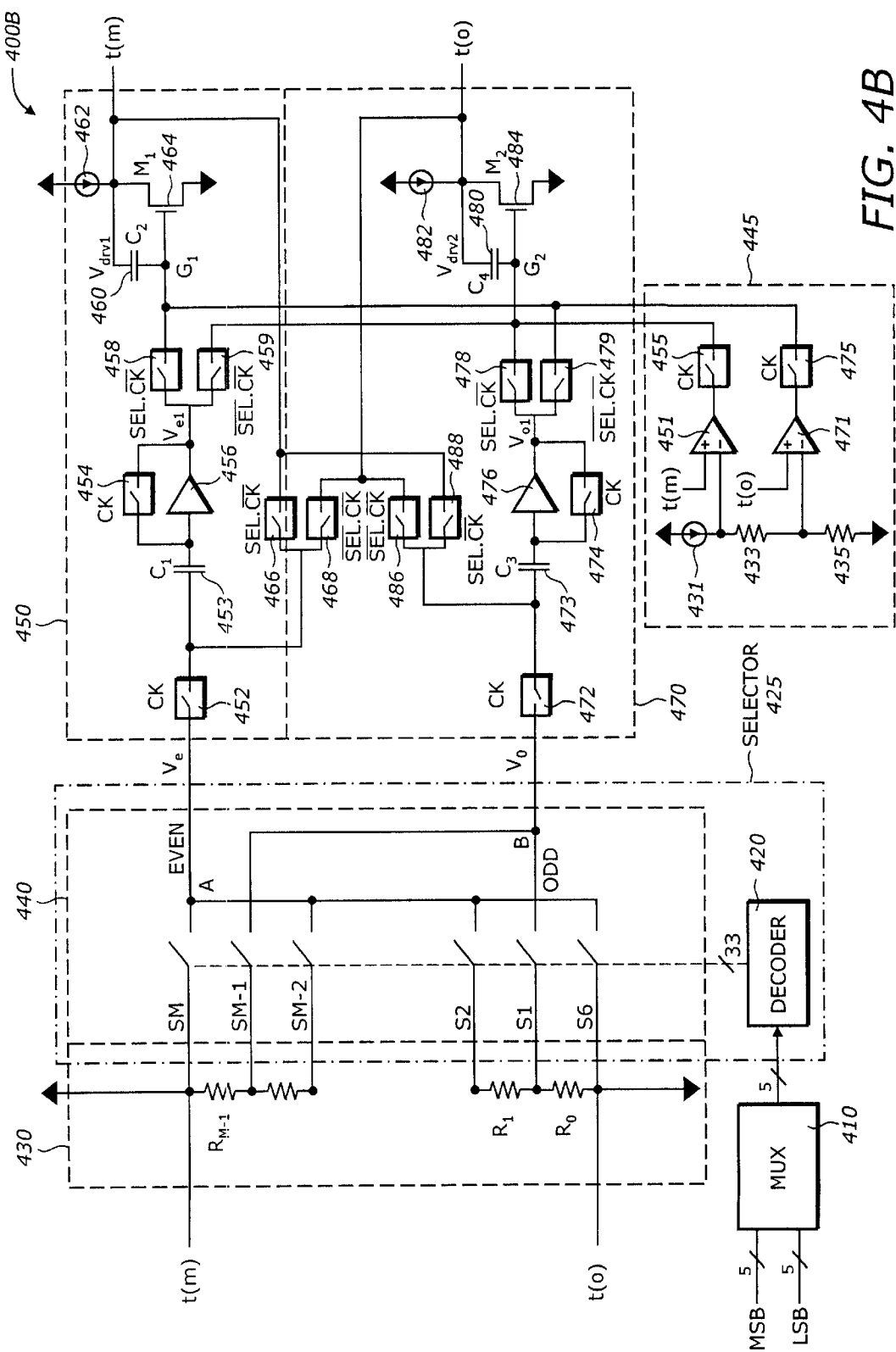
FIG. 4B is a diagram illustrating a faster two-stage DAC using a single resistor network, a single multiplexer circuit, and two-stage op-amp as sample-and-hold according to a preferred embodiment of the invention.

FIG. 4B is a diagram illustrating a faster two-stage DAC 400B using a single resistor network, a single multiplexer circuit, and two-stage op-amp as sample-and-hold according to a preferred embodiment of the invention. The DAC 400B is essentially similar to the DAC 400A shown in FIG. 4A except that the current source 432, the switches 434 and 436 in FIG. 4A are eliminated and a switching circuit 445 is added.

The switching circuit 445 includes a current source 431, resistors 433 and 435, amplifiers 451 and 471, and switches 455 and 475. The switching circuit 445 is connected to G1 and G2 terminals. The amplifiers 451 and 471 operate in the differential mode. The positive terminals of the amplifiers 451 and 471 are connected to t(M) and t(0), respectively. The two switches 455 and 475 are controlled by the CK signal. The switching circuit 445 enhances the speed performance of the converter.

Although the above embodiments are described in terms of two-stage operation and voltages, it is appreciated by one skilled in the art that alternative embodiments are possible. Examples of alternative embodiments include multi-stage converters, current amplifiers or current mode, and N bits of digital input where N is any positive integer numbers.

The present invention provides a simple and efficient technique to digital-to-analog conversion. The technique uses sample-and-hold circuits in a two-stage scheme. Various embodiments are disclosed. One embodiment uses a single resistor ladder network and cross-coupling two stage amplifiers. The technique reduces hardware complexity and effectively guarantees monotonicity.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for converting a digital word into an analog quantity, the method comprising:
    (a) generating a first plurality of signals from a resistor network;
    (b) selecting a first signal from the first plurality of signals based on a first half of the digital word;
    (c) generating a second plurality of signals from the single resistor network using the selected first signal; and
    (d) selecting a second signal from the second plurality of signals based on a second half of the digital word, the second signal corresponding to the analog quantity.

2. The method of claim 1 wherein selecting a first signal comprises:
    (b1) decoding the first half of the digital word to generate a first control word to a switching array, the switching array transferring the first plurality of signals according to the first control word; and
    (b2) combining the transferred first plurality of signals to generate the first signal.

3. The method of claim 1 wherein generating a second plurality of signals comprises:
    (c1) sampling the selected first signal in a first clock period;
    (c2) holding the sampled first signal in a second clock period; and
    (c3) providing the sampled and held first signal to the resistor network.

4. The method of claim 1 wherein selecting a second signal comprises:
    (d1) decoding the second half of the digital word to generate a second control word to a switching array, the switching array transferring the second plurality of signals according to the second control word; and
    (d2) combining the transferred second plurality of signals to generate the second signal.

5. A method for converting a digital word into an analog quantity, the method comprising:
    (a) generating a first plurality of signals from a resistor network;
    (b) selecting first top and bottom signals from the first plurality of signals based on a first half of the digital word;
    (c) generating a second plurality of signals from the resistor network using the selected first top and bottom signals; and
    (d) selecting second top and bottom signals from the second plurality of signals based on a second half of the digital word, one of the second top and bottom signals corresponding to the analog quantity.

6. The method of claim 5 wherein selecting first top and bottom signals comprises:
    (b1) decoding the first half of the digital word to generate a first control word to a switching array, the switching array transferring the plurality of signals according to the first control word; and
    (b2) combining the transferred signals to generate the first top and bottom signals.

7. The method of claim 5 wherein generating a second plurality of signals comprises:
    (c1) sampling the selected first top and bottom signals in a first clock period;
    (c2) holding the sampled first top and bottom signals in a second clock period; and
    (c3) providing the sampled and held first top and bottom signals to the resistor network.

8. The method of claim 7 further comprising:
    coupling the sampled and held first top and bottom signals to top and bottom drive circuits based on a select signal in the second clock period to generate top and bottom feedback signals; and
    coupling the top and bottom feedback signals to the resistor network to generate the second plurality of signals.

9. The method of claim 8 wherein coupling the sampled and held first top and bottom signals comprises:
    coupling the sampled and held first top and bottom signals to the top and bottom drive circuits, respectively, when the select signal is at a first logic level; and
    coupling the sampled and held first top and bottom signals to the bottom and top drive circuits, respectively, when the select signal is at a second logic level.

10. The method of claim 5 wherein selecting second top and bottom signals comprises:

(d1) decoding the second half of the digital word to generate a second control word to a switching array, the switching array transferring the second plurality of signals according to the second control word; and (d2) combining the transferred second plurality of signals to generate the second top and bottom signals.

11. An apparatus to convert a digital word to an analog quantity, the apparatus comprising:

a single resistor network to generate a first plurality of signals; an input multiplexer coupled to receive the digital word to provide a first half and a second half of the digital word;

a selector coupled to the resistor network to select a first signal from the first plurality of signals based on the first half of the digital word;

a sample-and-hold circuit coupled to the selector to provide a feedback signal from the selected first signal to the resistor network, the resistor network generating a second plurality of signals; and wherein the selector selects a second signal from the second plurality of signals based on the second half of the digital word, the second signal corresponding to the analog quantity.

12. The apparatus of claim 11 wherein the selector comprises:

a decoder coupled to the input multiplexer to decode the first half of the digital word to generate a first control word;

a switching array coupled to the decoder to transfer the first plurality of signals according to the first control word and to combine the transferred first plurality of signals to generate the first signal.

13. The apparatus of claim 11 wherein the sample-and-hold circuit:

samples the selected first signal in a first clock period;

holds the sampled first signal in a second clock period; and provides the sampled and held first signal to the single resistor network.

14. The apparatus of claim 11 wherein the decoder decodes the second half of the digital word to generate a second control word to the switching array, the switching array transferring the second plurality of signals according to the second control word and combining the transferred second plurality of signals to generate the second signal.

15. An apparatus to convert a digital word to an analog quantity, the apparatus comprising:

a resistor network to generate a first plurality of signals;

an input multiplexer coupled to receive the digital word to provide a first half and a second half of the digital word;

a selector coupled to the resistor network to select a first top and bottom signals from the first plurality of signals based on the first half of the digital word;

top and bottom sample-and-hold circuits coupled to the selector to provide top and bottom feedback signals from the selected first top and bottom signals to the resistor network, the resistor network generating a second plurality of signals; and wherein the selector selects second top and bottom signals from the second plurality of signals based on the second half of the digital word, one of the second top and bottom signals corresponding to the analog quantity.

16. The apparatus of claim 15 wherein the selector comprises:

a decoder coupled to the input multiplexer to decode the first half of the digital word to generate a first control word; and a switching array coupled to the decoder to transfer the plurality of signals according to the first control word and to combine the transferred signals to generate the first top and bottom signals.

17. The apparatus of claim 15 wherein the top and bottom sample-and-hold circuits:

sample the selected first top and bottom signals in a first clock period;

hold the sampled first top and bottom signals in a second clock period; and provide the sampled and held first top and bottom signals to the resistor network.

18. The apparatus of claim 17 further comprising:

top and bottom drive circuits coupled to the top and bottom sample-and-hold circuits to generate top and bottom feedback signals based on a select signal in the second clock period, the top and bottom feedback signals being coupled to the resistor network to generate the second plurality of signals.

19. The apparatus of claim 18 wherein the top and bottom sampled-and-hold circuits are coupled to the top and bottom drive circuits, respectively, when the select signal is at a first logic level; and the top and bottom sampled-and-hold circuits are coupled to the bottom and top drive circuits, respectively, when the select signal is at a second logic level.

20. The apparatus of claim 15 wherein the decoder decodes the second half of the digital word to generate a second control word to the switching array, the switching array transferring the second plurality of signals according to the second control word and combining the transferred second plurality of signals to generate the second top and bottom signals.

* * * * *